United States Patent
Slaoui et al.

(10) Patent No.: US 11,282,978 B2
(45) Date of Patent: Mar. 22, 2022

(54) CRYSTALLISATION OF AMORPHOUS SILICON FROM A SILICON-RICH ALUMINIUM SUBSTRATE

(71) Applicants: CENTRE NATIONAL de la RECHERCHE SCIENTIFIQUE, Paris (FR); UNIVERSITÉ de STRASBOURG, Strasbourg (FR)

(72) Inventors: Abdelilah Slaoui, Truchtersheim (FR); Pierre Bellanger, Strasbourg (FR); Alexander Ulyashin, Oslo (NO); Freddy Syvertsen, Oslo (NO)

(73) Assignees: CENTRE NATIONAL DE LA RECHERCHE SCIENTIFIQUE, Paris (FR); UNIVERSITÉ DE STRASBOURG, Strasbourg (FR)

( * ) Notice: Subject to any disclaimer, the term of this patent is extended or adjusted under 35 U.S.C. 154(b) by 0 days.

(21) Appl. No.: 16/096,992

(22) PCT Filed: Apr. 21, 2017

(86) PCT No.: PCT/FR2017/050951
§ 371 (c)(1),
(2) Date: Oct. 26, 2018

(87) PCT Pub. No.: WO2017/187061
PCT Pub. Date: Nov. 2, 2017

(65) Prior Publication Data
US 2019/0131485 A1 May 2, 2019

(30) Foreign Application Priority Data
Apr. 28, 2016 (FR) .................................. 16053838

(51) Int. Cl.
*H01L 31/18* (2006.01)
*H01L 31/0368* (2006.01)
(Continued)

(52) U.S. Cl.
CPC ............ *H01L 31/182* (2013.01); *C23C 16/24* (2013.01); *C23C 16/56* (2013.01); *C30B 1/023* (2013.01);
(Continued)

(58) Field of Classification Search
CPC ........... H01L 31/1804; H01L 31/03921; H01L 21/0245; H01L 21/02672; H01L 31/182;
(Continued)

(56) References Cited

U.S. PATENT DOCUMENTS 6,548,886 B1 * 4/2003 Ikari .................... H01L 21/3225 257/610
2002/0160553 A1 * 10/2002 Yamanaka ........ H01L 29/66772 438/149

(Continued)

OTHER PUBLICATIONS

International Search Report dated Jul. 14, 2017 in corresponding International Application No. PCT/FR2017/050951.
(Continued)

*Primary Examiner* — Golam Mowla
(74) *Attorney, Agent, or Firm* — B. Aaron Schulman, Esq.; Stites & Harbison, PLLC

(57) ABSTRACT

The invention relates to a method for manufacturing a semiconductor component comprising a thin layer of crystalline silicon on a substrate, comprising the steps of:
- providing a silicon-rich aluminum substrate (S0),
- depositing a thin layer of amorphous silicon on the substrate (S1), and
- applying thermal annealing (S2) to the thin layer of amorphous silicon to obtain a thin layer of crystalline silicon on the substrate.

5 Claims, 1 Drawing Sheet

Figure 1:
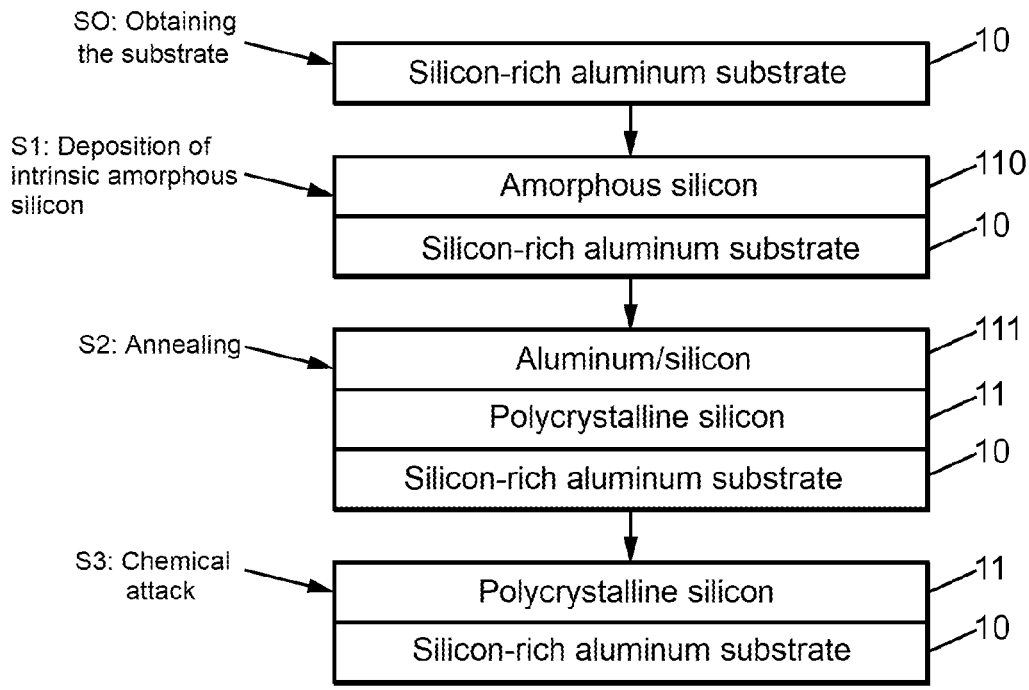

(51) Int. Cl.
*H01L 31/028* (2006.01)
*H01L 31/0392* (2006.01)
*H01L 31/0232* (2014.01)
*H01L 31/0288* (2006.01)
*H01L 31/0747* (2012.01)
*H01L 31/0224* (2006.01)
*C30B 29/06* (2006.01)
*C30B 1/02* (2006.01)
*H01L 21/02* (2006.01)
*C23C 16/24* (2006.01)
*C23C 16/56* (2006.01)
*C23C 16/50* (2006.01)

(52) U.S. Cl.
CPC .......... *C30B 29/06* (2013.01); *H01L 21/0245* (2013.01); *H01L 21/02425* (2013.01); *H01L 21/02532* (2013.01); *H01L 21/02667* (2013.01); *H01L 31/028* (2013.01); *H01L 31/0288* (2013.01); *H01L 31/02327* (2013.01); *H01L 31/03682* (2013.01); *H01L 31/03921* (2013.01); *H01L 31/0747* (2013.01); *H01L 31/1804* (2013.01); *H01L 31/1872* (2013.01); *C23C 16/50* (2013.01); *H01L 21/02672* (2013.01); *H01L 31/022425* (2013.01); *Y02E 10/546* (2013.01); *Y02E 10/547* (2013.01); *Y02P 70/50* (2015.11)

(58) Field of Classification Search
CPC ......... H01L 21/02532; H01L 21/02425; H01L 31/03682; H01L 31/1872; H01L 31/02327; H01L 31/028; H01L 31/0288; H01L 21/02667; H01L 31/0747; H01L 31/022425; C23C 16/24; C23C 16/50; C23C 16/56; C30B 1/023; C30B 29/06; Y02E 10/547; Y02E 10/546; Y02P 70/521
See application file for complete search history.

(56) References Cited

U.S. PATENT DOCUMENTS

| 2003/0003694 A1* | 1/2003 | Voutsas ............... C23C 14/0682 438/478 |
| 2003/0094611 A1* | 5/2003 | Hayakawa ........ H01L 21/02381 257/49 |
| 2003/0143827 A1* | 7/2003 | Wenham ............. H01L 31/1804 438/597 |
| 2010/0184276 A1 | 7/2010 | Maboudian et al. |

OTHER PUBLICATIONS

Bellanger, et al., "Understanding Phenomena of Thin Silicon Film Crystallization on Aluminium Substrates", Dec. 1, 2015, pp. 156-164, vol. 84, Energy Procedia, XP029380401.

* cited by examiner

CRYSTALLISATION OF AMORPHOUS SILICON FROM A SILICON-RICH ALUMINIUM SUBSTRATE

The present invention relates to the production of crystalline silicon in a thin layer on a substrate, in particular, but not exclusively, for photovoltaic applications.

The solar cells used in the photovoltaic application are, for about 90%, made from crystalline silicon wafers obtained by cutting an ingot. In addition, amorphous silicon crystallization techniques, such as laser induced crystallization (LIC) or solid phase crystallization (SPC), are known.

Nevertheless, these techniques are energy intensive, and/or consume raw material and time.

The present invention improves the situation.

To this end, the invention proposes a method of manufacturing a semiconductor component comprising crystalline silicon in a thin layer on a substrate. The method preferably comprises the following steps:
  providing a silicon-rich aluminum substrate,
  depositing a thin layer of amorphous silicon on the substrate, and
  applying thermal annealing to the thin layer of amorphous silicon to obtain a thin layer of crystalline silicon on the substrate.

The thin layer of crystalline silicon may comprise, after annealing, a surface coating of silicon mixed with aluminum. Optionally, the method may then comprise an additional step of etching the surface of the thin layer of crystalline silicon to remove the surface coating. Nevertheless, in certain possible applications, it may be advantageous to maintain this naturally-forming coating.

The term "silicon-rich" is understood to mean a proportion of between 5 and 50% of silicon in a silicon and aluminum alloy, and preferably between 12 and 50%. Such a proportion may be measured by atomic spectrophotometry in the substrate itself. The value of such a proportion is again found in the substrate after the aforementioned annealing step, because the substrate material is supersaturated with silicon, while, finally, relatively very little silicon of the substrate is used during the annealing.

Thus, in one possible embodiment, the substrate is made of an aluminum and silicon alloy initially comprising between 5 and 50% of silicon, and preferably between 12 and 50% of silicon. As described below, such a substrate is very simple to manufacture.

In an exemplary embodiment, the thermal annealing temperature is, for example, between 450 and 550° C., for durations of between twenty minutes and twelve hours, and is applied to an amorphous silicon layer which may have a thickness between 1 and 10 μm.

Advantageously, the thin layer of crystalline silicon obtained is more specifically a thin layer of P+ doped polycrystalline silicon with aluminum.

Since the thin layer of crystalline silicon may advantageously form a seed for initiating the deposition of a second thin layer of silicon on top, the method may advantageously further comprise a step of depositing a second thin silicon layer on the thin layer of crystalline silicon.

Thus, in particular in the case of a semiconductor component for a photovoltaic application where such a P+ doped crystalline silicon layer forms a back surface field layer of a photovoltaic cell, it is then possible to provide a second thin layer of silicon (typically a P doped layer in this example of a photovoltaic application) deposited on this thin layer of P+ crystalline silicon, which forms a seed to promote the deposition of this second layer.

The present invention also relates to a semiconductor component comprising crystalline silicon in a thin layer on a substrate. In particular, the substrate consists of an aluminum and silicon alloy, predominantly aluminum.

In one embodiment, the aforementioned thin layer more precisely may comprise P+ doped poly-crystalline silicon with aluminum.

In an embodiment specific to a photovoltaic application, the component further comprises:
  a second P doped layer deposited on the thin layer of P+ doped polycrystalline silicon,
  a third N doped layer, deposited on the second layer,
  at least one conductive transparent coating on the third layer, and
  contacts deposited on the coating.

Such a component then forms at least one photovoltaic cell, in particular a solar panel.

In one possible embodiment, the second P doped layer and the third N doped layer are made of silicon (and, in particular, the N doped layer may be made of amorphous silicon).

In an embodiment where the component is intended for photovoltaic application, the P+ doped poly-crystalline silicon thin layer with aluminum may advantageously form a back surface field layer (BSF).

In an embodiment where the component is intended for a photovoltaic application, the substrate (mainly made of aluminum) may also form an optically-reflective mirror.

The invention then offers the many advantages set out below.

The cost of producing thin silicon layers is lower than that of wafers made of crystalline silicon. An electricity production price of less than 0.4 €/Wp is estimated for solar cells made from thin layers of silicon.

A silicon-rich aluminum substrate produced at a low price, and used for the purposes of the invention as a catalyst for crystallizing amorphous silicon, has the advantage of a lower thermal budget than that of competing technologies such as laser induced crystallization (LIC) or solid phase crystallization (SPC).

In addition, a so-called "aluminum-induced crystallization" (AIC) technique is known, which consists of respectively depositing two layers of aluminum and silicon on one another, in order to crystallize the silicon after annealing. However, such a technique uses very thin layers of aluminum and amorphous silicon (thicknesses of less than 200 nm) on a substrate generally of glass. Thus, the interaction between the two layers results in a polysilicon layer that has at most the thickness of the initial amorphous silicon layer. It will be understood that this technique has many limitations with respect to the growth of silicon crystalline layers suitable for applications of semiconductor components and, in particular, for photovoltaic applications. Furthermore, in this technique of the prior art, it is necessary to evaporate the aluminum metal, which requires an additional reactor to finally produce the polysilicon layer.

The silicon-rich aluminum substrate may be advantageously used as a support during the manufacture of photovoltaic cells made from the stack of thin silicon layers. Such a substrate plays the role, in this application of the manufacture of photovoltaic cells, both of back contact and reflector after complete manufacture of the cells. In fact, the aluminum substrate can play the role of an optical mirror in order to promote the light-matter interaction in the overlying thin layers. It should be noted here, however, that an initially pure aluminum substrate may not be used as an alternative, due to diffusion of the uncontrolled silicon during the development of the overlying silicon layers. After annealing, the crystallized layer then comprises crystalline silicon doped with aluminum, and then forms a P+ layer usually used as a back surface field (BSF) of a photovoltaic cell. In addition, this layer of crystalline silicon may serve as a seed for the deposition of a P doped overlying layer, for example silicon (for example amorphous or micro-amorphous silicon, or even polycrystalline silicon), which is thicker and is formed by growth on the polycrystalline layer. The rest of the design of the silicon-based cell may be carried out conventionally according to the prior art, in particular with the deposition of a thin N doped silicon layer, of a transparent layer (TCO type), and comb contacts above it.

Thus, the silicon-rich aluminum substrate constitutes a reflective and conductive support for deposited silicon thin layers in an application for the manufacture of photovoltaic cells. Such a substrate (initially acting as a catalyst for the crystallization of amorphous silicon) makes it possible to obtain a continuous layer of polycrystalline silicon that may be used as a back surface field (BSF) of a solar cell, while maintaining a low thermal budget.

Figure 2:
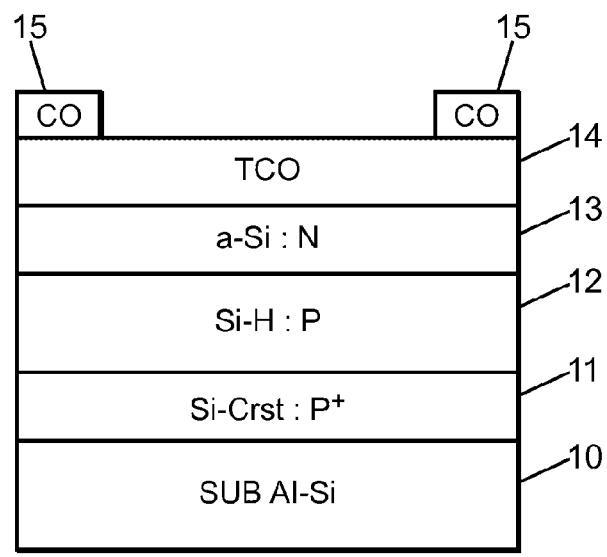

Other features and advantages of the invention will become apparent upon examining the detailed description below, and the appended drawings, wherein:

FIG. 1 shows an exemplary embodiment of the method according to the invention, of the crystallization of amorphous silicon on a silicon-rich aluminum substrate;

FIG. 2 schematically shows a solar cell comprising a P+ doped thin layer obtained by implementing the method of the invention.

The invention provides a low temperature crystallization method for an amorphous silicon layer on a silicon-rich aluminum substrate. The silicon-rich aluminum substrate is used as a catalyst for the crystallization of amorphous silicon and provides a continuous polycrystalline silicon layer that may be used as a back surface field (BSF) of photovoltaic solar cells. It has been observed that a pure aluminum substrate is not suitable for direct use because of the high diffusivity and solubility of silicon in aluminum. The use of the silicon-rich aluminum substrate thus makes it possible to limit the diffusion and crystallization of amorphous silicon on the surface.

Such a method makes it possible to obtain a crystalline silicon film a few microns thick, directly on a silicon-rich aluminum substrate.

In an exemplary embodiment, the method comprises three steps:
(i) deposition of the intrinsic amorphous silicon on a silicon-rich aluminum substrate,
(ii) annealing at low temperature (for example less than 550° C.), and
(iii) a chemical etching process for etching the residual surface layer consisting essentially of aluminum and silicon in order to access the underlying polycrystalline layer.

Thus, with reference to FIG. 1, the crystallization of the amorphous silicon on a silicon-rich aluminum substrate may be obtained as follows.

In a first step S1, a deposit of the intrinsic amorphous silicon 110 is carried out in a reactor, for example of the PECVD type (Plasma Enhanced Chemical Vapor Deposition), or other, on the silicon-rich aluminum substrate 10. Thicknesses between 1 and 10 μm are deposited at a growth rate of the order of 50 to 100 nm/s, for example about 90 nm/s. More precisely, the deposition conditions may be as follows:

a microwave power of between 600 and 700 W, preferably of the order of 650 W, a substrate temperature of between 200 and 300° C., preferably of the order of 250° C., a flow rate of $SiH_4$ of between 20 and 50 sccm, preferably of the order of 30 sccm, a flow rate of argon-type neutral gas of between 20 and 50 sccm, preferably of the order of 35 sccm, and a pressure of between 30 and 50 mTorr, preferably of the order of 40 mTorr.

In a second step S2, the annealing is carried out in a conventional tubular furnace under controlled nitrogen flow (flow rate of the order of 120 sccm) at temperatures of between 450° C. and 550° C., as, for example, in embodiments at 490° C., 520° C. or 550° C., and durations between twenty minutes and twelve hours. The higher the annealing temperature, the shorter the annealing time. It should be further noted that the melting point of the substrate (eutectic at atmospheric pressure) is only slightly higher or close to 550° C. In addition, under the conditions of a conventional Al—Si alloy substrate with more than 50% aluminum, the annealing temperature should be limited to about 550° C., and, if necessary (depending on the thickness of the amorphous Si layer or other parameter), the duration of annealing should be increased.

During this thermal annealing step S2, a physicochemical phenomenon may possibly be explained as follows. Silicon atoms of the amorphous layer have a sufficiently high energy to leave their bond and diffuse towards the substrate. They interact with aluminum, which promotes their crystallization. These atoms then use just the amount of energy needed for their crystallization, and release the excess. Simultaneously, silicon atoms of the substrate are released and move towards the interface with the layer and also initiate crystallization. Moreover, the amount of aluminum that may also migrate to the overlying layer is limited by a "natural" barrier constituted by an oxide layer (for example alumina $Al_2O_3$) at the interface between the substrate and the overlying amorphous silicon layer.

Thus, at the end of this annealing step, a polycrystalline silicon layer 11 is formed on the silicon-rich aluminum substrate 10. There is furthermore a surface layer 111 of aluminum-silicon mixture, that then needs to be stripped in a third subsequent step.

In this third step S3, the silicon/aluminum mixture created on the top of the substrate is etched in a solution of $HNO_3$, HF, $H_2O$ (in exemplary proportions of the order of 72.5 ml/1.5 ml/28 ml). Thus, as illustrated in FIG. 1, at the end of this step S3, there remains a layer 11 of P+ doped polycrystalline silicon with aluminum, on the silicon-rich aluminum substrate 10.

A possible prior step S0 may be required to obtain the silicon-rich aluminum substrate 10. In reality, such a substrate is very simple to manufacture because aluminum and silicon are very miscible and the Al/Si alloy is very easy to achieve.

For a photovoltaic application, the absorbent layer of the cell may then be created by deposition of amorphous, or micro-amorphous, silicon, or by epitaxial growth of a thicker polycrystalline layer, on the first crystalline layer obtained from step S3 above.

Reference is then made to FIG. 2 to describe the structure of a photovoltaic cell comprising such layers.

The photovoltaic cell comprises, in particular:
an aluminum substrate rich in silicon (metal), and
a layer 11 of poly-crystalline silicon P+ doped with aluminum, which comprise, with the substrate 10, the minimum elements of such a photovoltaic cell.

It will thus be understood that the substrate 10 and the layer 11 form characteristic elements of a semiconductor component within the meaning of the invention (and directly obtained by the implementation of the method of the invention), in particular, but not exclusively, for a photovoltaic application.

In this particular application, the cell may further comprise a layer of silicon 12 (P doped), which may be amorphous or crystalline, wherein the underlying layer 11 forms a seed to promote the deposition of this layer 12. In addition, deposition of an N doped additional layer 13, (for example doped amorphous silicon) may be provided to form the "diode" corresponding to the complete cell. Conventionally, provision is furthermore made for a layer 14 of transparent conductive oxide (TCO), typically made of ITO (Indium-Tin-Oxygen) or zinc oxide ZnO, on which metal contacts 15 of the cell are deposited.

Such an embodiment has many advantages.

The aluminum plates used as substrates may be produced in an industrial manner (pouring, extrusion, etc.), thus without any industrial limit. The amorphous silicon layer precursor to crystallization is produced from a gas (silane), but alternatively it is also possible to use trichlorosilane (first by-product of the combustion of sand, and thus widely available). Annealing furnaces for heat treatment and crystallization are widely used in electronics, photovoltaics and metallurgy. Consequently, there is no limit to the method of the invention in order to obtain such a layer 11 deposited on the substrate 10. However, the limit in temperature elevation of the aluminum substrate may be given as around 550° C. maximum. In this case, however, it is sufficient to extend the duration of the annealing and the possible durations of deposition by epitaxy, if necessary.

Of course, the present invention is not limited to the embodiments described above by way of example; it extends to other variants.

For example, to overcome the difficulty of the temperature limit of 550° C. that is not to be exceeded a priori, an annealing furnace may be provided that is optimized to crystallize plates in large series for periods of a few hours (between 20 minutes to 12 hours) as previously described).

Furthermore, it may be advantageous to treat amorphous, micro-amorphous or polycrystalline silicon layers containing, in fact, aluminum incrustation defects which affect the performance of the final solar cell. To this end, passivation of the defects in a hydrogen atmosphere at low temperature makes it possible to improve the performances.

Furthermore, P doping of the second silicon layer has been described above as an example. Of course, alternatively, it may be an I (intrinsic) or N doping. In addition, the third N doped (amorphous) silicon layer may be more particularly n+ doped.

The invention claimed is:

1. A method of manufacturing a semiconductor component comprising a thin layer of crystalline silicon on a substrate, said method comprising:
providing a substrate comprising an aluminum and silicon alloy initially having between 12% and 50% of silicon,
depositing a thin layer of amorphous silicon, said thin layer of amorphous silicon being in direct contact with the aluminum and silicon alloy of the substrate, and
applying thermal annealing to the thin layer of amorphous silicon to obtain the thin layer of crystalline silicon, said thin layer of crystalline silicon being in direct contact with the aluminum and silicon alloy of the substrate, wherein the substrate, after thermal annealing, comprises the same proportion of silicon than before thermal annealing.

2. The method according to claim 1, wherein the thin layer of crystalline silicon comprises a surface coating of silicon mixed with aluminum, and wherein the method further comprises etching the surface of the thin layer of crystalline silicon to remove the surface coating.

3. The method according to claim 1, wherein the thermal annealing temperature is between 450 and 550° C. for periods of between twenty minutes and twelve hours, and is applied to an amorphous silicon layer of thickness between 1 and 10 μm.

4. The method according to claim 1, wherein the thin layer of crystalline silicon is a thin layer of P+ doped poly-crystalline silicon with aluminum.

5. The method according to one claim 1, further comprising depositing a second thin layer of silicon on the thin layer of crystalline silicon, wherein the thin layer of crystalline silicon forms a seed to promote the deposition of the second thin layer of silicon.

* * * * *